United States Patent
Mueller et al.

(10) Patent No.: US 10,503,866 B2
(45) Date of Patent: Dec. 10, 2019

(54) TIME-DISCRETE MODELING METHOD FOR A MOTOR VEHICLE

(71) Applicant: Bayerische Motoren Werke Aktiengesellschaft, Munich (DE)

(72) Inventors: Jonas Mueller, Munich (DE); Felix Lins, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 186 days.

(21) Appl. No.: 15/601,399

(22) Filed: May 22, 2017

(65) Prior Publication Data
US 2017/0262575 A1    Sep. 14, 2017

Related U.S. Application Data

(63) Continuation of application No. PCT/EP2015/076558, filed on Nov. 13, 2015.

(30) Foreign Application Priority Data

Dec. 8, 2014   (DE) .................. 10 2014 225 123

(51) Int. Cl.
*G06F 17/50*    (2006.01)
*B60W 50/00*    (2006.01)

(52) U.S. Cl.
CPC ...... *G06F 17/5095* (2013.01); *G06F 17/5009* (2013.01); *B60W 50/0097* (2013.01);
(Continued)

(58) Field of Classification Search
CPC ................................................ G06F 17/5009
(Continued)

(56) References Cited

U.S. PATENT DOCUMENTS

| 2001/0023393 | A1 | 9/2001 | Hagiwara et al. |
| 2005/0154513 | A1* | 7/2005 | Matsunaga ........... B60T 8/1725 701/38 |
| 2014/0214783 | A1 | 7/2014 | Stichling et al. |

FOREIGN PATENT DOCUMENTS

| DE | 101 12 280 A1 | 9/2001 |
| DE | 10 2004 019 320 A1 | 8/2005 |

(Continued)

OTHER PUBLICATIONS

Budaciu C., et al., "The Influence of Finite Word Length Representation of the Delta Predictive Controller Design for Automotive Powertrain Systems," System Theory, Control, and Computing (ICSTCC), 2011 15th IEEE International Conference on Oct. 14, 2011, pp. 1-6, XP032023714 (Six (6) pages).

(Continued)

*Primary Examiner* — Maceeh Anwari
(74) *Attorney, Agent, or Firm* — Crowell & Moring LLP

(57) ABSTRACT

A universal modeling method is provided for a motor vehicle, the universal modeling method including: providing an input signal set, the input signal set comprising those signals of respective sensors of the motor vehicle which can be relevant for the control of devices of the motor vehicle; selecting a set of modeling signals from the input signal set as a function of a system architecture of the motor vehicle; and determining an output signal set by way of a time-discrete selective state space model modeling function taking into account the set of modeling signals. In this case, the output signal set functions as a signal set for controlling corresponding actuators of the devices of the motor vehicle.

11 Claims, 4 Drawing Sheets

(52) U.S. Cl.
CPC ............... *B60W 2050/0018* (2013.01); *B60W 2050/0031* (2013.01)

(58) Field of Classification Search
USPC .......................................................... 701/36
See application file for complete search history.

(56) References Cited

FOREIGN PATENT DOCUMENTS

| | | |
|---|---|---|
| DE | 10 2012 016 610 A1 | 2/2014 |
| EP | 2 759 964 A1 | 7/2014 |
| WO | WO 2013/049930 A1 | 4/2013 |

OTHER PUBLICATIONS

Anonymous, "Zustandsraumdarstellung—Wikipedia," retrieved from the URL: https://web.archive.org/web/20140731185717/http://de.wikipedia.org/wiki/Zustandsraumdarstellung dated Jul. 31, 2014, XP055248535 (Twenty-Three (23) pages).

German Search Report issued in counterpart German Application DE 10 2014 225 123.0 dated Oct. 8, 2015 with partial English translation (fourteen (14) pages).

International Search Report (PCT/ISA/210) issued in PCT Application No. PCT/EP2015/076558 dated Feb. 17, 2016 with English translation (seven (7) pages).

German-language Written Opinion (PCT/ISA/237) issued in PCT Application No. PCT/EP2015/076558 dated Feb. 17, 2016 (five (5) pages).

\* cited by examiner

TIME-DISCRETE MODELING METHOD FOR A MOTOR VEHICLE

CROSS REFERENCE TO RELATED APPLICATIONS

This application is a continuation of PCT International Application No. PCT/EP2015/076558, filed Nov. 13, 2015, which claims priority under 35 U.S.C. § 119 from German Patent Application No. 10 2014 225 123.0, filed Dec. 8, 2014, the entire disclosures of which are herein expressly incorporated by reference.

BACKGROUND AND SUMMARY OF THE INVENTION

The present invention relates to a method for controller development for motor vehicles.

For controller development in the vehicle, a fundamental distinction is drawn between the program version and the data version of the respective controller.

The program version is what is known as the software framework and contains all instructions for the operations to be performed, such as the addition of two signals, the multiplication of a signal by a fixed value or the writing/reading of signals to and from the bus system, for example.

The data version contains what are known as application labels, such as, inter alia, the aforementioned fixed value, for example, and therefore allows the controller software to be matched to a specific vehicle. Typical examples are the matching of physical vehicle parameters such as mass, wheelbase, stiffnesses or the fine tuning of character-shaping functions, such as the gas pedal interpretation, for example.

The development process draws a significant distinction between the program version and the data version. To enhance synergies, attempts are made to keep the same program version locally for as long as possible over many projects, what is known as building block software. This increases tuning complexity and the duration of development loops. The reason is that any change must be confirmed by numerous bodies or escalation levels.

By contrast, data versions are project-individual by definition and can normally be changed without any overhead even at late project times.

With building block software, that is to say the conventional functional framework, a conflict of objectives arises in this case: either the set of building blocks contains only the strict overlap between all projects involved, in which case the individual requirements of the individual projects need to be incorporated as what are known as balcony solutions, or the set of building blocks contains the union of all projects. In this case, unused content must have input data disabled, which wastes resources.

It would therefore be desirable to provide an option that provides an improved building block solution.

It is an object of the invention to provide an option that avoids or at least reduces at least some of the disadvantages known in the prior art.

This and other objects are achieved according to the invention by a universal modeling method for a motor vehicle, the universal modeling method involving: provision of an input signal set, the input signal set having those signals of applicable sensors of the motor vehicle that may be relevant for controlling apparatuses of the motor vehicle, selection of a modeling signal set from the input signal set, on the basis of a system architecture of the motor vehicle, and determination of an output signal set by a time-discrete selective state space model modeling function taking into consideration the modeling signal set. In this case, the output signal set acts as a signal set for actuating applicable actuators of the apparatuses of the motor vehicle.

The method steps can be performed in automated fashion in this case.

A signal within the context of the invention may be a magnitude sensed by a sensor that can be converted into an electrical value.

In this case, control of an apparatus of the motor vehicle within the context of the invention means a process that results in actuation of an apparatus of the motor vehicle. Preferably this involves apparatuses that can influence the driving behavior of the motor vehicle.

In this case, a system architecture of the motor vehicle within the context of the invention may be model formation for the motor vehicle, particularly model formation for the motor vehicle apparatuses that can influence the driving behavior of the motor vehicle.

In this case, an output signal set within the context of the invention may be a number of electrical signals, which may be a result of the universal modeling method. In this case, this electrical signal set can act as an input variable for one or more actuators of one or more motor vehicle apparatuses. In the simplest case, the output signal set can have merely one electrical signal, the value of which has a different value than a zero signal. However, the output signal set can also have the same dimension as the input signal set. In this case, all output signals that are not needed can be set to zero.

The teaching according to the invention achieves the advantage that a universal option can be provided for a modeling method for manipulated variables of actuators of a motor vehicle. Hence, the universal modeling method can be used for any motor vehicle types and motor vehicle models.

Before configurations of the invention are described in more detail below, it should first of all be noted that the invention is not limited to the components described or the method steps described. In addition, the terminology used is also not a restriction, but rather is merely exemplary in nature. Where the description and the claims used are singular, this always also includes the plural, unless the context explicitly precludes this. Any method steps can, unless the context explicitly precludes this, be performed in automated fashion and in any order.

In accordance with a first exemplary configuration of the method, the universal modeling method further involves the state space model modeling function having a motor vehicle mode function. In this case, the universal modeling method further involves determination of a motor vehicle mode of a motor vehicle for the motor vehicle mode function, and in this case the determination of the output signal set is effected taking into consideration a result of application of the modeling signal set to the motor vehicle mode function.

In this case, a motor vehicle mode function within the context of the invention can mean a function that can map a particular operating state of a motor vehicle. By way of example, a motor vehicle mode can mean vibration damping for a motor vehicle. In this case, functions that can map the gears, the clutch statuses, starting and the like can be used. In this case, everything together can form an applicable motor vehicle mode function for vibration damping for a motor vehicle.

This configuration has the advantage that different modes of a motor vehicle can be mapped using the same method and hence relevant apparatuses of the applicable motor vehicle can be actuated.

In accordance with a further exemplary configuration, the universal modeling method further involves the state space model modeling function further having a reference system function that corresponds to a motor-vehicle-specific reference system of the motor vehicle, and in this case the determination of the output signal set is effected taking into consideration a result of application of the modeling signal set to the reference system function.

In this case, a reference system function within the context of the invention can mean a function that can be used generally as a reference for a motor vehicle. Such a function can also have a group of functions.

This configuration has the advantage that a motor vehicle can be mapped in complex fashion as a mathematical function, which means that the model formation for the motor vehicle can be more accurate.

In accordance with a further exemplary configuration, the universal modeling method further involves the state space model modeling function further having an observer system that has an estimated system response of the motor vehicle. In this case, the determination of the output signal set is effected taking into consideration a result of application of the modeling signal set to the observer system.

This configuration has the advantage that the model formation for the motor vehicle can be even more accurate.

In accordance with a further exemplary configuration, the universal modeling method further involves the input signal set furthermore having a zero signal.

In this case, a zero signal within the context of the invention may be an electrical signal that can act as a zero value. By way of example, the zero signal can, in the event of it being available as a voltage, correspond to a reference ground potential or a zero potential. If the signal is embodied as a current, for example, then the zero signal can have the value 0A, hence be currentless. The zero signal can be used as a reference variable for the universal modeling method.

This configuration has the advantage that a reference variable can be used for the universal modeling method, which means that the signals can have a lower tolerance. This means that the method can be more accurate.

In accordance with a further exemplary configuration, the universal modeling method further involves the selection of the modeling signal set from the input signal set involving zeroing of those signals from the input signal set that are not needed for the modeling signal set. In this case, the zeroing is effected by means of the zero signal such that the signals from the input signal set that are not needed for the modeling signal set correspond to the value of the zero signal.

This configuration has the advantage that signal errors can be reduced.

In accordance with a further exemplary configuration, the universal modeling method further involves the determination of the motor vehicle mode being effected by way of an association table of the system architecture of the motor vehicle.

This configuration has the advantage that it is therefore a simple matter for a particular motor vehicle mode to become mappable from a system architecture of the motor vehicle.

In accordance with a further exemplary configuration, the universal modeling method further involves the observer system having a physical system description of the motor vehicle.

In this case, a physical system description within the context of the invention can map the physical response of the motor vehicle. Physical variables that can identify the physical response may in this case be, by way of example, descriptions for an acceleration response, a traction, and the like, of the motor vehicle to be modeled.

This configuration has the advantage that the universal modeling method can use even more accurate maps of the physical circumstances of the motor vehicle.

In accordance with a further exemplary configuration, the universal modeling method further involves the determination of the output signal set involving application of the result of the application of the modeling signal set to the motor vehicle mode function, of the result of the application of the modeling signal set to the reference system function and of the result of the application of the modeling signal set to the observer system to a control function. In this case, the control function acts as part of the discrete-time selective state space model modeling function.

In this case, a control function within the context of the invention may be a function that can provide one or more applicable controllers for the modeling signal set.

This configuration has the advantage that control can be provided for a motor vehicle apparatus or multiple motor vehicle apparatuses of the motor vehicle.

In accordance with a further exemplary configuration, the universal modeling method further involves the modeling signal set for the determination of the result of the application of the modeling signal set to the motor vehicle mode function having a difference from the modeling signal set for the determination of the result of the application of the modeling signal set to the modeling function. This is effected by means of a different selection of the signals from the input signal set for the respective modeling signal set.

This configuration has the advantage that individual modeling signal sets may be usable for the motor vehicle mode function, the reference system function and the observer system. Hence, the universal modeling method can generate even more accurate results.

The invention therefore allows a universal modeling method to be used in order to map arbitrary motor vehicle modes of motor vehicles and to perform applicable control for applicable motor vehicle apparatuses.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
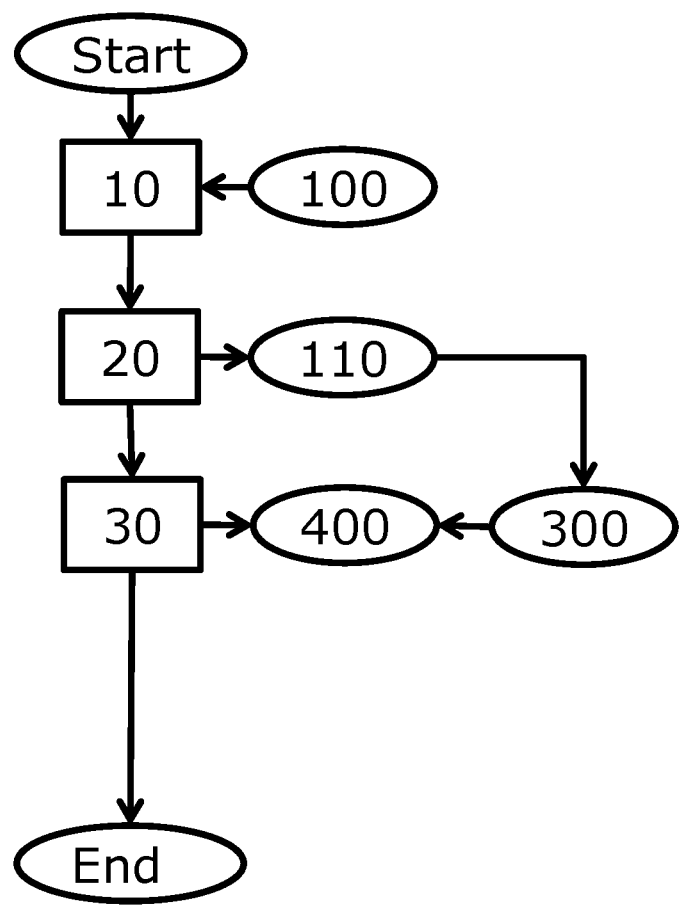
FIG. 1 is a schematic depiction of a proposed method according to an exemplary configuration of the invention.

FIG. 1 shows a schematic depiction of a proposed method according to an exemplary configuration of the invention. In this case, FIG. 1 shows a schematic depiction of a universal modeling method for a motor vehicle. The universal modeling method involves: provision 10 of an input signal set 100, the input signal set 100 having those signals of applicable sensors of the motor vehicle that may be relevant for controlling apparatuses of the motor vehicle, selection 20 of a modeling signal set 110 from the input signal set 100, and determination 30 of an output signal set 400 by way of a time-discrete selective state space model modeling function 300 taking into consideration the modeling signal set 110, wherein the output signal set 400 acts as a signal set for actuation of applicable actuators of the apparatuses of the motor vehicle.

Figure 2:
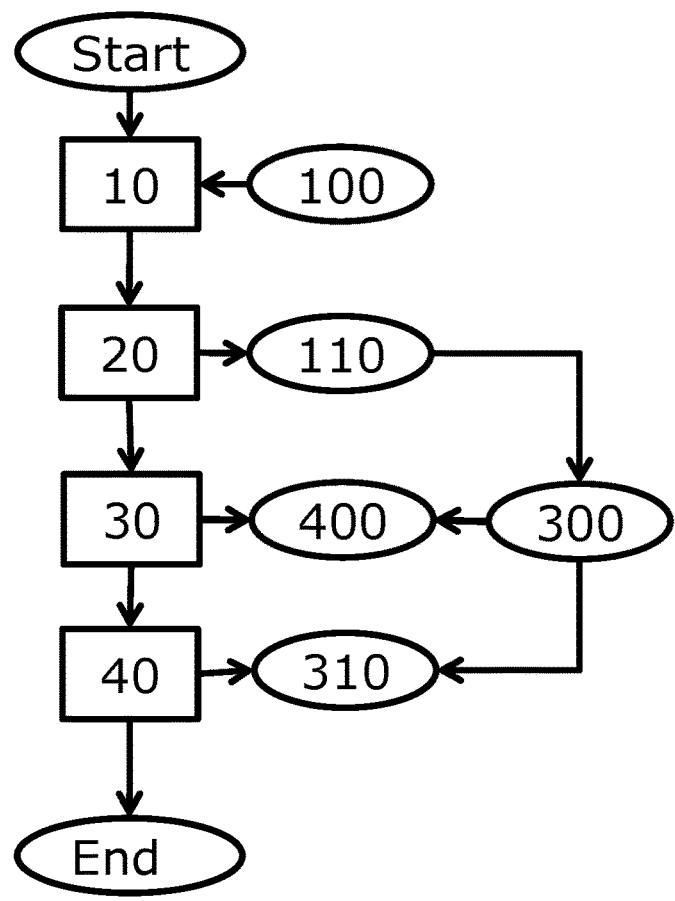
FIG. 2 is a schematic depiction of a proposed method according to a further exemplary configuration of the invention.

FIG. 2 shows a schematic depiction of a proposed method according to a further exemplary configuration of the invention.

In this case, FIG. 2 shows a schematic depiction of a method that is extended in comparison with the method from FIG. 1. The statements above relating to FIG. 1 also apply accordingly to FIG. 2.

As is evident from FIG. 2, the universal modeling method furthermore involves the state space model modeling function 300 having a motor vehicle mode function 310. In this case, the universal modeling method further involves: determination 40 of a motor vehicle mode of the motor vehicle for the motor vehicle mode function 310, and wherein the determination 30 of the output signal set 400 is effected taking into consideration a result of application of the modeling signal set 110 to the motor vehicle mode function 310.

Figure 3:
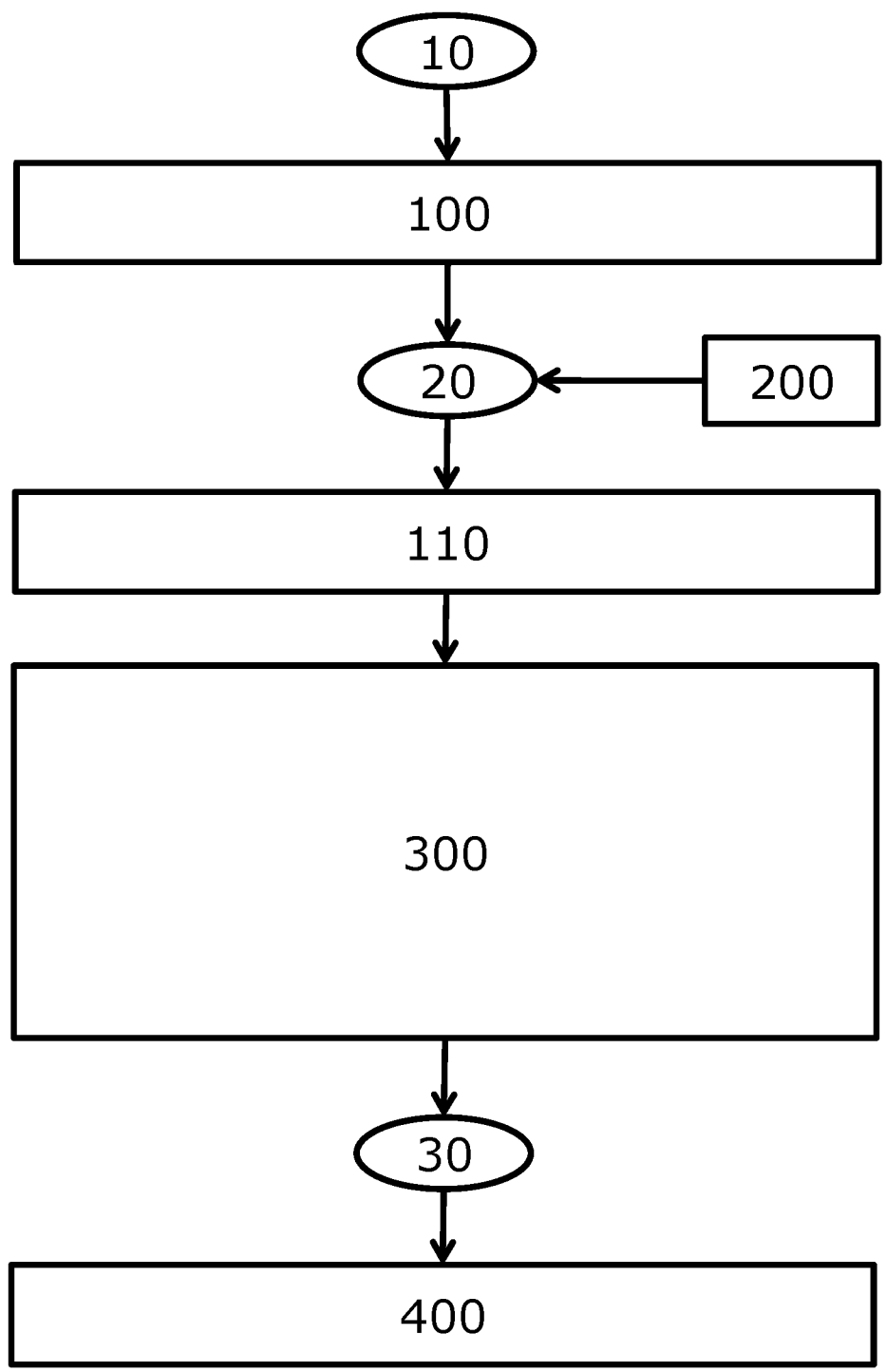
FIG. 3 is a further schematic depiction of a proposed method according to the exemplary configuration of the invention shown in FIG. 1.
Figure 4:
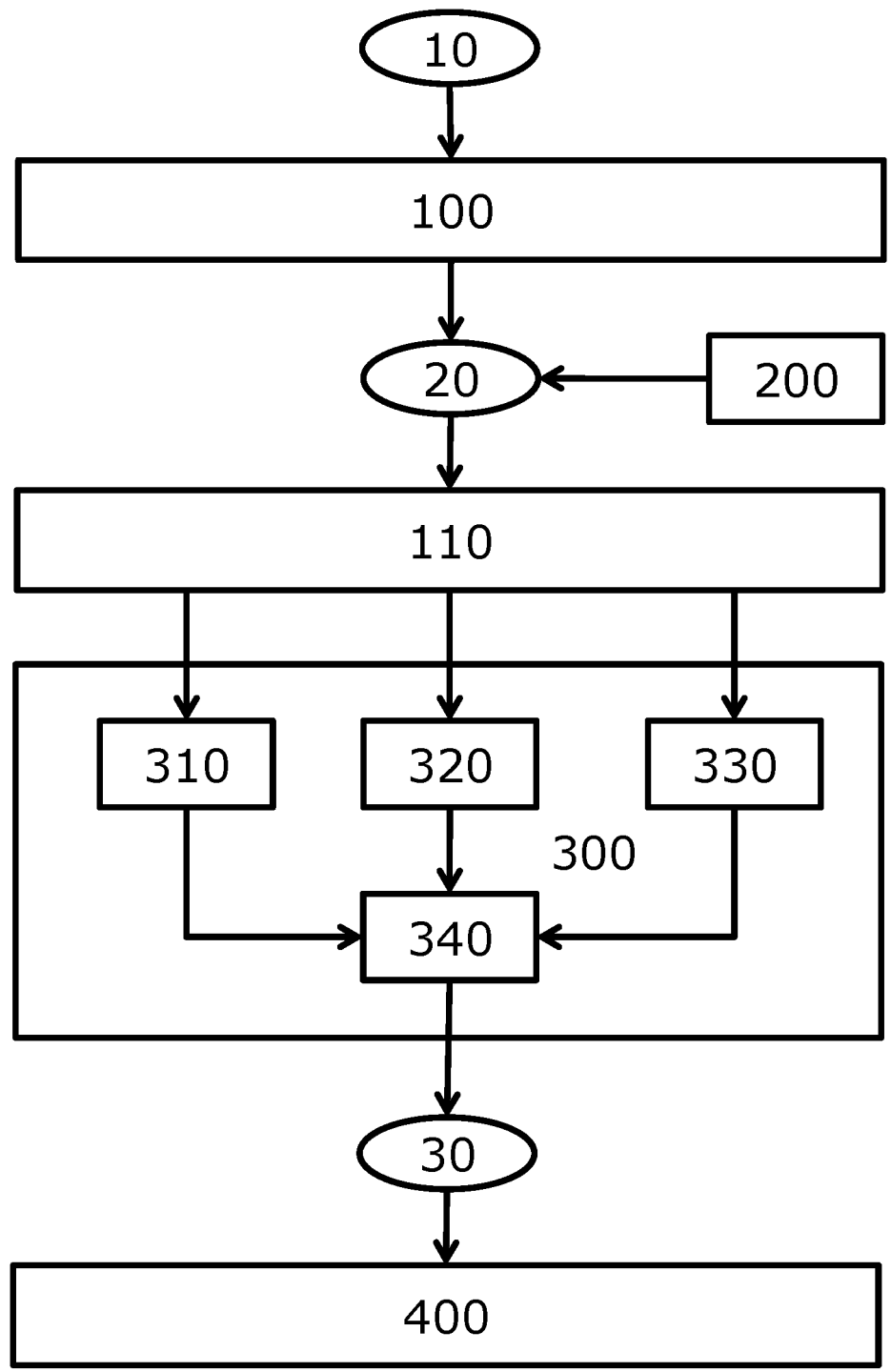
FIG. 4 is a further schematic depiction of a proposed method according to the exemplary configuration of the invention shown in FIG. 2.

FIG. 3 and FIG. 4 depict the corresponding methods from the perspective of the signal paths. The ellipsoidal boxes depict the method steps that result in the corresponding signals.

FIG. 3 shows a further schematic depiction of a proposed method according to the exemplary configuration of the invention shown in FIG. 1.

In this case, FIG. 3 shows a further schematic depiction of a method that is extended in comparison with the method from FIG. 1. The statements above relating to FIG. 1 also apply accordingly to FIG. 3.

In FIG. 3, the selection 20 of the modeling signal set 110 from the input signal set 100 is effected on the basis of a system architecture 200 of the motor vehicle.

FIG. 4 shows a further schematic depiction of a proposed method according to the exemplary configuration of the invention shown in FIG. 2.

In this case, FIG. 4 shows a further schematic depiction of a method that is extended in comparison with the method from FIG. 2. The statements above relating to FIG. 2 also apply accordingly to FIG. 4.

As is evident from FIG. 4, the state space model modeling function 300 has a motor vehicle mode function 310, a reference system function 320, an observer system 330 and a control function 340. The same or different signals as applicable modeling signal sets 110 are used for the motor vehicle mode function 310, the reference system function 320 and the observer system 330 in order to supply results thereof to the control function. The result of the latter results in the determination 30 of the output signal set 400.

The inventive concept can be summarized as follows. A method is provided that can allow a building block function to be compiled whose program code merely provides the implementation of one or more abstract state space models. The program code without specific input of data is moreover complete without a function. On the basis of this basic framework, the implementation for the projects can be depicted solely on a data basis by the applicable system matrices. The following function types, inter alia, are suitable for such implementation (but not definitively): control functions, filter functions, coordination functions, functions with a dependency on a driving experience switch mode. It is therefore possible for any number of dynamic systems to be depicted using local software. This allows function development to be practiced on a project-individual basis and into the late phase, without having to make changes to the basic function. The system matrices that are stored as application parameters can be ascertained and adjusted using popular tools such as Matlab, for example. Ultimately, it is therefore possible to achieve accurate control for systems/apparatuses of motor vehicles without needing to provide a separate balcony solution for each motor vehicle. It is therefore possible for a piece of control software to be matched to a specific vehicle. Typical examples are the matching of physical vehicle parameters such as mass, wheelbase, stiffnesses and the like, for example, or the fine tuning of character-shaping functions of the motor vehicle, such as gas pedal interpretation, for example.

The basic framework of the state space model is moreover suitable for depicting any dynamic systems on the basis of a local computation specification. Furthermore, there are multiple modes of operation for many functions. These can likewise be depicted by means of suitable switching of the system matrices.

LIST OF REFERENCE SYMBOLS

10 Provision of the input signal set
20 Selection of the modeling signal set
21 Zeroing of signals
30 Ascertainment of the output signal set
40 Ascertainment of a motor vehicle mode of the motor vehicle
100 Input signal set
110 Modeling signal set
120 Zero signal
200 System architecture
300 State space model modeling function
310 Motor vehicle mode function
320 Reference system function
330 Observer system
340 Control function
400 Output signal set The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A universal modeling method for a motor vehicle, the universal modeling method comprising the acts of:
   providing an input signal set, the input signal set having those signals of applicable sensors of the motor vehicle that may be relevant for controlling apparatuses of the motor vehicle;
   selecting a modeling signal set from the input signal set, on the basis of a system architecture of the motor vehicle; and
   determining an output signal set by way of a time-discrete selective state space model modeling function taking into consideration the modeling signal set, wherein the output signal set acts as an electrical signal configured to actuate applicable actuators of the apparatuses of the motor vehicle wherein the input signal set has a zero signal; and wherein the selection of the modeling signal set from the input signal set comprises: zeroing of those signals from the input signal set that are not needed for the modeling signal set, wherein the zeroing is effected by way of the zero signal such that the signals from the input signal set that are not needed for the modeling signal set correspond to the value of the zero signal.

2. The universal modeling method as claimed in claim 1, wherein
the state space model modeling function has a motor vehicle mode function, and wherein the universal modeling method further comprising the acts of:
determining a motor vehicle mode of the motor vehicle for the motor vehicle mode function, wherein
the determining of the output signal set is effected taking into consideration a result of application of the modeling signal set to the motor vehicle mode function.

3. The universal modeling method as claimed in claim 2, wherein
the state space model modeling function further has a reference system function that corresponds to a motor-vehicle-specific reference system of the motor vehicle, and
the determining of the output signal set is effected taking into consideration a result of application of the modeling signal set to the reference system function.

4. The universal modeling method as claimed in claim 3, wherein
the state space model modeling function further has an observer system that has an estimated system response of the motor vehicle, and
the determining of the output signal set is effected taking into consideration a result of application of the modeling signal set to the observer system.

5. The universal modeling method as claimed in claim 4, wherein
the determining of the output signal set involves application of:
(i) a result of the application of the modeling signal set to the motor vehicle mode function,
(ii) a result of the application of the modeling signal set to the reference system function, and
(iii) a result of the application of the modeling signal set to the observer system,
to a control function, and wherein the control function acts as part of the discrete-time selective state space model modeling function.

6. The universal modeling method as claimed in claim 5, wherein
the modeling signal set for the determining of the result of the application of the modeling signal set to the motor vehicle mode function has a difference from the modeling signal set for the determining of the result of the application of the modeling signal set to the time-discrete selective state space model modeling function, by way of a different selection of the signals from the input signal set for the respective modeling signal set.

7. The universal modeling method as claimed in claim 2, wherein
the determining of the motor vehicle mode is effected by way of an association table of the system architecture of the motor vehicle.

8. The universal modeling method as claimed in claim 1, wherein
the state space model modeling function further has a reference system function that corresponds to a motor-vehicle-specific reference system of the motor vehicle, and
the determining of the output signal set is effected taking into consideration a result of application of the modeling signal set to the reference system function.

9. The universal modeling method as claimed in claim 1, wherein
the state space model modeling function further has an observer system that has an estimated system response of the motor vehicle, and
the determining of the output signal set is effected taking into consideration a result of application of the modeling signal set to the observer system.

10. The universal modeling method as claimed in claim 9, wherein
the observer system has a physical system description of the motor vehicle.

11. A universal modeling method for a motor vehicle, the universal modeling method comprising the acts of:
providing an input signal set, the input signal set having a zero signal and those signals of applicable sensors of the motor vehicle that may be relevant for controlling apparatuses of the motor vehicle;
selecting a modeling signal set from the input signal set, on the basis of a system architecture of the motor vehicle; and
determining an output signal set by way of a time-discrete selective state space model modeling function taking into consideration the modeling signal set, wherein the output signal set acts as a signal configured to actuate applicable actuators of the apparatuses of the motor vehicle,
wherein selecting the modeling signal set from the input signal set comprises zeroing of those signals from the input signal set that are not needed for the modeling signal set,
wherein the zeroing is effected by way of the zero signal such that the signals from the input signal set that are not needed for the modeling signal set correspond to the value of the zero signal.

* * * * *